United States Patent
Huang et al.

(10) Patent No.: US 12,470,135 B2
(45) Date of Patent: *Nov. 11, 2025

(54) COMPARATOR-BASED SWITCHED-CAPACITOR CIRCUIT

(71) Applicant: REALTEK SEMICONDUCTOR CORPORATION, Hsinchu (TW)

(72) Inventors: Shih-Hsiung Huang, Hsinchu (TW); Wei-Cian Hong, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 404 days.

This patent is subject to a terminal disclaimer.

(21) Appl. No.: 18/119,861

(22) Filed: Mar. 10, 2023

(65) Prior Publication Data

US 2023/0308016 A1    Sep. 28, 2023

(30) Foreign Application Priority Data

Mar. 22, 2022    (TW) .................................. 111110684

(51) Int. Cl.
    *H02M 3/07*    (2006.01)
(52) U.S. Cl.
    CPC ..................... *H02M 3/07* (2013.01)
(58) Field of Classification Search
    CPC ............................................... H02M 3/07–078
    See application file for complete search history.

(56) References Cited

U.S. PATENT DOCUMENTS

| | | | |
|---|---|---|---|
| 8,686,888 B2 | 4/2014 | Chou et al. | |
| 11,177,821 B1* | 11/2021 | Steensgaard-Madsen | ................... H03M 1/42 |
| 11,750,160 B1* | 9/2023 | Lok | ....................... H03M 1/164 330/295 |
| 12,206,431 B2* | 1/2025 | Huang | ................... H03M 1/167 |
| 2011/0169340 A1* | 7/2011 | Straayer | ................. H02M 3/07 307/109 |
| 2016/0011615 A1 | 1/2016 | Hu et al. | |

OTHER PUBLICATIONS

A.M. Abo. P.R. Gray"A 1.5-V, 10-bit, 14.3-MS/s CMOS pipeline analog-to-digital converter" IEEE Journal of Solid-State Circuits (vol. 34, Issue: 5, May 1999).

(Continued)

*Primary Examiner* — Peter M Novak
(74) *Attorney, Agent, or Firm* — WPAT, PC (57) ABSTRACT

A comparator-based switched-capacitor circuit (SC circuit) has a first output terminal and a second output terminal, which output a first output signal and a second output signal, respectively. The comparator-based SC circuit includes a switch-capacitor network, a first current source, a second current source, and a compensation circuit. The first current source is coupled to the switch-capacitor network and the first output terminal. The second current source is coupled to the switch-capacitor network and the second output terminal. The compensation circuit is coupled to the first output terminal and the second output terminal and configured to generate a first and second voltage differences corresponding respectively to the first and second output signals and apply the first and second voltage differences to the second and first output terminals, respectively.

10 Claims, 5 Drawing Sheets

(56) References Cited

OTHER PUBLICATIONS

Mohammad Taherzadeh-Sani; Anas A. Hamoui"Area and Power Optimization of High-Order Gain Calibration in Digitally-Enhanced Pipelined ADCs" IEEE Transactions on Very Large Scale Integration (VLSI) Systems (vol. 18, Issue: 4, Apr. 2010).

* cited by examiner

COMPARATOR-BASED SWITCHED-CAPACITOR CIRCUIT

BACKGROUND OF THE INVENTION

1. Field of the Invention

The present invention generally relates to a switched-capacitor circuit (SC circuit), and, more particularly, to a comparator-based SC circuit.

2. Description of Related Art

Figure 1:
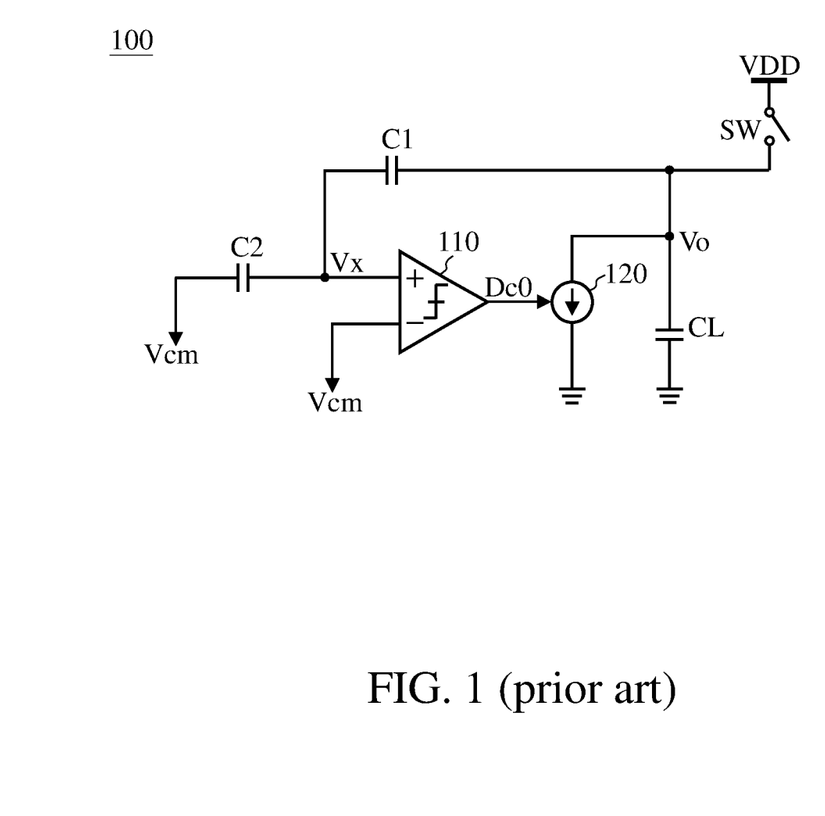
FIG. 1 shows a conventional comparator-based SC circuit.

FIG. 1 shows a conventional comparator-based SC circuit, which is also referred to as a zero-crossing-based circuit (ZCBC). The SC circuit 100 includes a comparator 110, a current source 120, a capacitor C1, a capacitor C2, a load capacitor CL, and a switch SW. Various circuits can be built based on the SC circuit 100, such as a multiplying digital-to-analog converter (multiplying DAC) of a pipelined analog-to-digital converter (pipelined ADC, also referred to as pipeline ADC).

The comparator 110 compares the voltage Vx at the positive input terminal with the reference voltage Vcm at the negative input terminal to generate the control signal Dc0, which controls the output current of the current source 120 to control the magnitude of the output voltage Vo (i.e., the terminal voltage of the load capacitor CL). When the switch SW is turned on, the output voltage Vo is reset to the power supply voltage VDD.

The current source 120 is usually embodied by a Metal-Oxide-Semiconductor Field-Effect Transistor (MOSFET), and the output voltage Vo is the drain voltage of the transistor. However, as the drain-source current of the current source 120 (Ids, which is the output current of the current source 120) is dependent on the drain-source voltage (Vds), the output current of the current source 120 is affected by the output voltage Vo; this may cause the load capacitor CL to overly discharge and thus decrease the linearity of the SC circuit 100.

SUMMARY OF THE INVENTION

In view of the issues of the prior art, an object of the present invention is to provide a comparator-based SC circuit, so as to make an improvement to the prior art.

According to one aspect of the present invention, a comparator-based switched-capacitor circuit (SC circuit) having a first input terminal, a second input terminal, a first output terminal, and a second output terminal is provided. The first output terminal outputs a first output signal, and the second output terminal outputs a second output signal. The comparator-based SC circuit includes a comparator, a first switch, a second switch, a third switch, a fourth switch, a fifth switch, a sixth switch, a seventh switch, an eighth switch, a ninth switch, a tenth switch, a first current source, a second current source, a first capacitor, a second capacitor, a third capacitor, a fourth capacitor, and a compensation circuit. The first current source is coupled to the comparator and the first output terminal. The second current source is coupled to the comparator and the second output terminal. The first capacitor has a first end and a second end. The first end is coupled to the first input terminal through the first switch and coupled to the first output terminal through the fourth switch. The second end is coupled to the comparator and coupled to a reference voltage through the third switch. The second capacitor has a third end and a fourth end. The third end is coupled to the first input terminal through the second switch and coupled to the reference voltage through the fifth switch. The fourth end is coupled to the comparator and coupled to the reference voltage through the third switch. The third capacitor has a fifth end and a sixth end. The fifth end is coupled to the second input terminal through the sixth switch and coupled to the second output terminal through the ninth switch. The sixth end is coupled to the comparator and coupled to the reference voltage through the eighth switch. The fourth capacitor has a seventh end and an eighth end. The seventh end is coupled to the second input terminal through the seventh switch and coupled to the reference voltage through the tenth switch. The eighth end is coupled to the comparator and coupled to the reference voltage through the eighth switch. The compensation circuit is coupled to the first output terminal and the second output terminal and configured to generate a first voltage difference corresponding to the first output signal and a second voltage difference corresponding to the second output signal, and to apply the first voltage difference and the second voltage difference to the second output terminal and the first output terminal, respectively.

According to another aspect of the present invention, a comparator-based switched-capacitor circuit (SC circuit) having a first input terminal, a second input terminal, a first output terminal, and a second output terminal is provided. The first output terminal outputs a first output signal, and the second output terminal outputs a second output signal. The comparator-based SC circuit includes a comparator, a first switch, a second switch, a third switch, a fourth switch, a fifth switch, a sixth switch, a seventh switch, an eighth switch, a ninth switch, a tenth switch, an eleventh switch, a twelfth switch, a thirteenth switch, a fourteenth switch, a first current source, a second current source, a second capacitor, a third capacitor, a fourth capacitor, a fifth capacitor, and a sixth capacitor. The first current source is coupled to the comparator and the first output terminal. The second current source is coupled to the comparator and the second output terminal. The first capacitor has a first end and a second end. The first end is coupled to the first input terminal through the first switch and coupled to the first output terminal through the fourth switch. The second end is coupled to the comparator and coupled to a first reference voltage through the third switch. The second capacitor has a third end and a fourth end. The third end is coupled to the first input terminal through the second switch and coupled to the first reference voltage through the fifth switch. The fourth end is coupled to the comparator and coupled to the first reference voltage through the third switch. The third capacitor has a fifth end and a sixth end. The fifth end is coupled to the second input terminal through the sixth switch and coupled to the second output terminal through the ninth switch. The sixth end is coupled to the comparator and coupled to the first reference voltage through the eighth switch. The fourth capacitor has a seventh end and an eighth end. The seventh end is coupled to the second input terminal through the seventh switch and coupled to the first reference voltage through the tenth switch. The eighth end is coupled to the comparator and coupled to the first reference voltage through the eighth switch. The fifth capacitor has a ninth end and a tenth end. The ninth end is coupled to the first output terminal through the eleventh switch and coupled to the second output terminal through the fourteenth switch. The tenth end is coupled to a second reference voltage. The sixth capacitor has an eleventh end and a twelfth end. The eleventh end is coupled to the second output terminal through the twelfth switch and coupled to the first output terminal through the thirteenth switch. The twelfth end is coupled to the second reference voltage.

The technical means embodied in the embodiments of the present invention can solve at least one of the problems of the prior art. Therefore, the present invention has better linearity compared with the prior art.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a comparator-based switched-capacitor circuit. On account of that some or all elements of the comparator-based switched-capacitor circuit could be known, the detail of such elements is omitted provided that such detail has little to do with the features of this disclosure, and that this omission nowhere dissatisfies the specification and enablement requirements. A person having ordinary skill in the art can choose components or steps equivalent to those described in this specification to carry out the present invention, which means that the scope of this invention is not limited to the embodiments in the specification.

Figure 2:
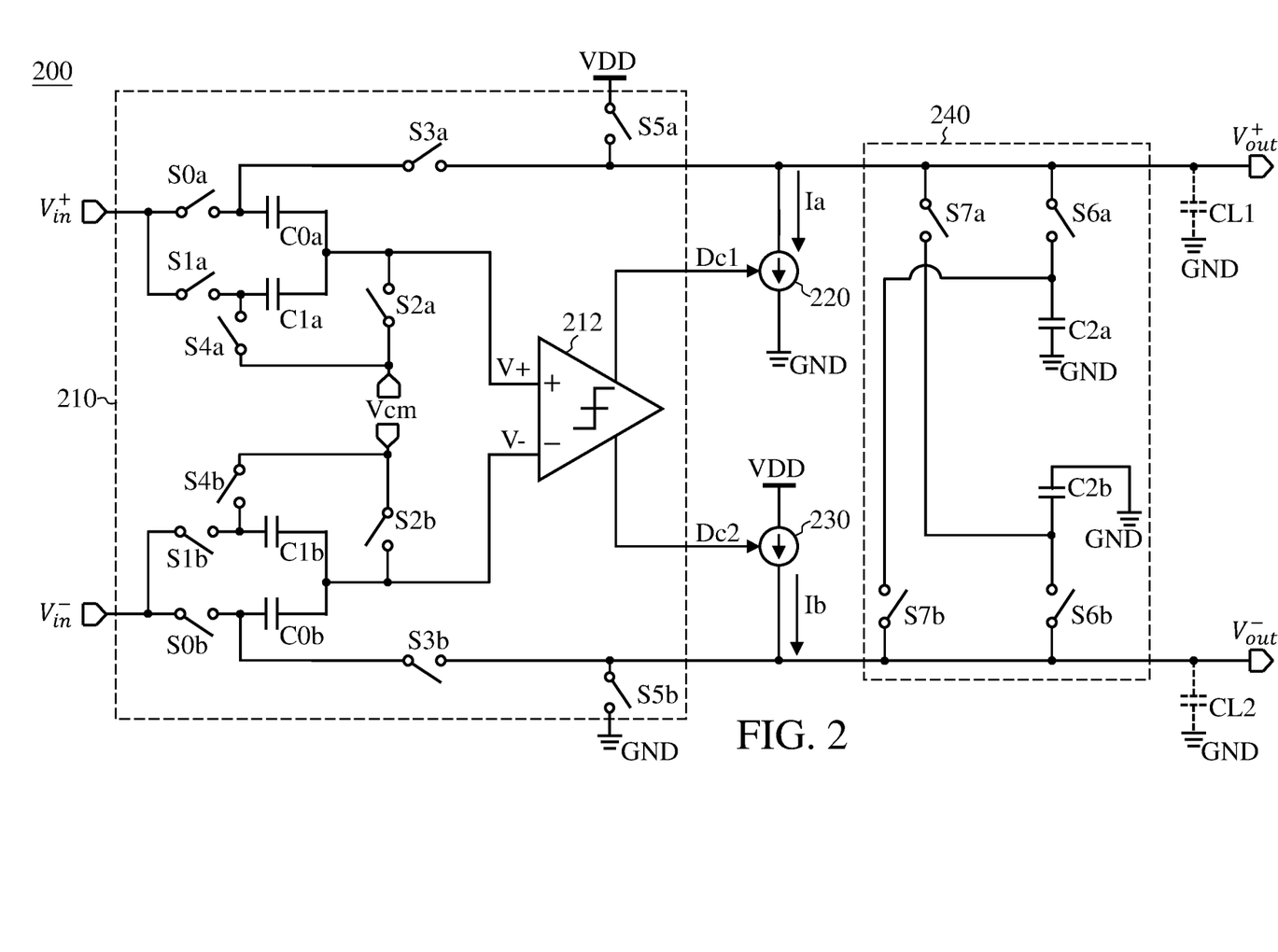
FIG. 2 is a circuit diagram of a comparator-based SC circuit according to an embodiment of the present invention.

FIG. 2 is a circuit diagram of a comparator-based SC circuit according to an embodiment of the present invention. The SC circuit 200 includes a switch-capacitor network 210, a current source 220, a current source 230, and a compensation circuit 240. The SC circuit 200 has a first input terminal (i.e., the terminal receiving the input signal $V_{in}^+$), a second input terminal (i.e., the terminal receiving the input signal $V_{in}^-$), a first output terminal (i.e., the terminal outputting the output signal $V_{out}^+$), and a second output terminal (i.e., the terminal outputting the output signal $V_{out}^-$). The current source 220 is coupled between the first output terminal and the ground level GND. The current source 230 is coupled between the power supply voltage VDD and the second output terminal. More specifically, the current source 220 is embodied by an N-channel Metal-Oxide-Semiconductor Field-Effect Transistor (NMOS transistor for short); the drain and the source of the NMOS transistor are coupled or electrically connected to the first output terminal and the ground level GND, respectively, and the gate of the NMOS transistor receives the control signal Dc1. The current source 230 is embodied by a P-channel Metal-Oxide-Semiconductor Field-Effect Transistor (PMOS transistor for short); the drain and the source of the PMOS transistor are coupled or electrically connected to the second output terminal and the power supply voltage VDD, respectively, and the gate of the PMOS transistor receives the control signal Dc2.

The load capacitor CL1 is coupled between the first output terminal and the ground level GND. The load capacitor CL2 is coupled between the second output terminal and the ground level GND. The compensation circuit 240 is coupled between the first output terminal and the second output terminal. The SC circuit 200 samples the differential input signal $V_{in}$ (including the input signals $V_{in}^+$ and $V_{in}^-$) in a sampling phase, and outputs the differential output signal $V_{out}$ (including the output signals $V_{out}^+$ and $V_{out}^-$) in a holding phase.

The switch-capacitor network 210 includes a comparator 212, a capacitor C0a, a capacitor C1a, a capacitor C0b, a capacitor C1b, switches S0a to S5a, and switches S0b to S5b. The reference voltage Vcm is the common mode voltage of the input signals $V_{in}^+$ and $V_{in}^-$. In some embodiments, the capacitance values of the capacitors C0a, C1a, C0b, and C1b are substantially the same.

One end of the capacitor C0a is coupled to the first input terminal through the switch S0a and to the first output terminal through the switch S3a; the other end of the capacitor C0a is coupled to the comparator 212 and to the reference voltage Vcm through the switch S2a. One end of the capacitor C1a is coupled to the first input terminal through the switch S1a and to the reference voltage Vcm through the switch S4a; the other end of the capacitor C1a is coupled to the comparator 212 and to the reference voltage Vcm through the switch S2a. One end of the capacitor C0b is coupled to the second input terminal through the switch S0b and to the second output terminal through the switch S3b; the other end of the capacitor C0b is coupled to the comparator 212 and to the reference voltage Vcm through the switch S2b. One end of the capacitor C1b is coupled to the second input terminal through the switch S1b and to the reference voltage Vcm through the switch S4b; the other end of the capacitor C1b is coupled to the comparator 212 and to the reference voltage Vcm through the switch S2b.

The SC circuit 200 operates alternately in the sampling phase and the holding phase. In the sampling phase, the switch S0a, the switch S1a, the switch S2a, the switch S0b, the switch S1b, and the switch S2b are turned on, and the switch S3a, the switch S4a, the switch S3b, and the switch S4b are turned off. In the holding phase, the switch S3a, the switch S4a, the switch S3b, and the switch S4b are turned on, and the switch S0a, the switch S1a, the switch S2a, the switch S0b, the switch S1b, and the switch S2b are turned off.

The compensation circuit 240 includes a capacitor C2a, a capacitor C2b, a switch S6a, a switch S6b, a switch S7a, and a switch S7b. One end of the capacitor C2a is coupled to the ground level GND; the other end of the capacitor C2a is coupled to the first output terminal through the switch S6a and to the second output terminal through the switch S7b. One end of the capacitor C2b is coupled to the ground level GND; the other end of the capacitor C2b is coupled to the second output terminal through the switch S6b and to the first output terminal through the switch S7a. The switch S6a is coupled between the capacitor C2a and the first output terminal. The switch S6b is coupled between the capacitor C2b and the second output terminal. One end of the switch S7a is coupled to the first output terminal; the other end of the switch S7a is coupled to the capacitor C2b and the switch S6b. One end of the switch S7b is coupled to the second output terminal; the other end of the switch S7b is coupled to the capacitor C2a and the switch S6a.

Figure 3:
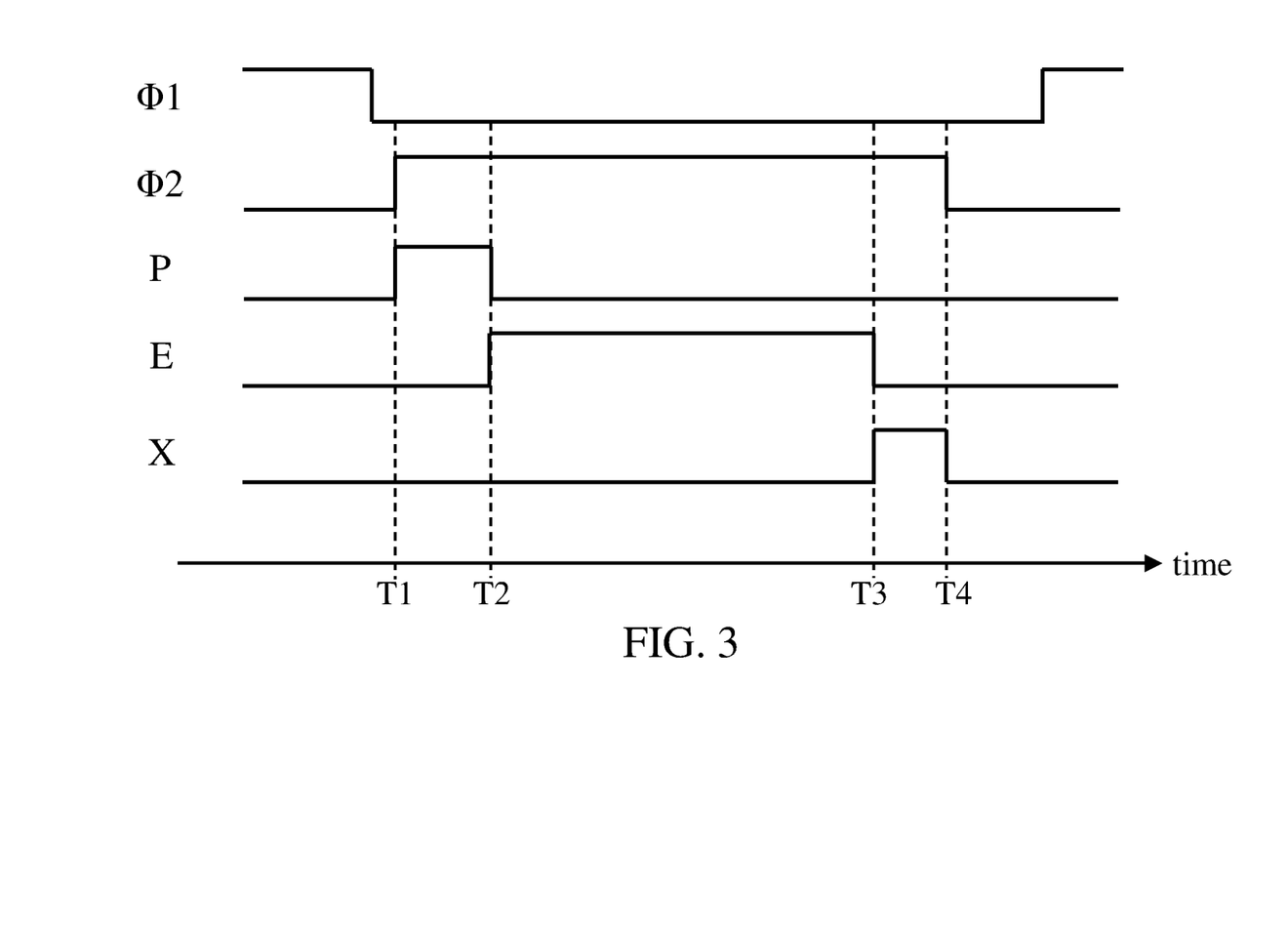
FIG. 3 is a timing diagram according to an embodiment of the present invention.

FIG. 3 is a timing diagram according to an embodiment of the present invention. The sampling phase corresponds to the clock Φ1 being at the first level (e.g., a high level), and the holding phase corresponds to the clock Φ2 being at the first level (e.g., between the time point T1 and the time point T4). The holding phase is made up of three sub-phases: the phase P, the phase E, and the phase X. The switch S5a and the switch S5b are turned on for a predetermined time period (T2−T1) in the phase P to reset the first output terminal and the second output terminal (the switch S5a and the switch S5b are turned off at other times), and then the current source 220 and the current source 230 are turned on (i.e., supplying current) in the phase E (between the time point T2 and the time point T3) to discharge load capacitor CL1 and charge load capacitor CL2. The voltage V+ and the voltage V− are the input voltages of the comparator 212. The comparator 212 compares the voltage V+ and the voltage V− and outputs the control signal Dc1 and the control signal Dc2. When V+≥V−, the control signal Dc1 is at the first level (e.g., the high level or logic 1), and the control signal Dc2 is at the second level (e.g., a low level or logic 0). When V+<V−, the control signal Dc1 is at the second level, and the control signal Dc2 is at the first level.

The voltage V+ varies with the output signal $V_{out}^+$, and the voltage V− varies with the output signal $V_{out}^-$. The time point T3 corresponds to the reverse of the voltages at the input terminals of the comparator 212 (i.e., from V+≥V− to V+<V−, and vice versa); that is, the current source 220 and the current source 230 are turned off (stop supplying current) at the time point T3.

The switch S6a and the switch S6b are turned on in the phase E and turned off at other times. That is, in the phase E, the capacitor C2a discharges and the capacitor C2b charges. Because the current Ia of the current source 220 is proportional to the drain voltage of the current source 220 (i.e., the output signal $V_{out}^+$), the final (when the phase E ends) terminal voltage of the capacitor C2a is inversely proportional to the output signal $V_{out}^+$. On the other hand, because the current Ib of the current source 230 is inversely proportional to the drain voltage of the current source 230 (i.e., the output signal $V_{out}^-$), the final (when the phase E ends) terminal voltage of the capacitor C2b is inversely proportional to the output signal $V_{out}^-$.

Figure 4:
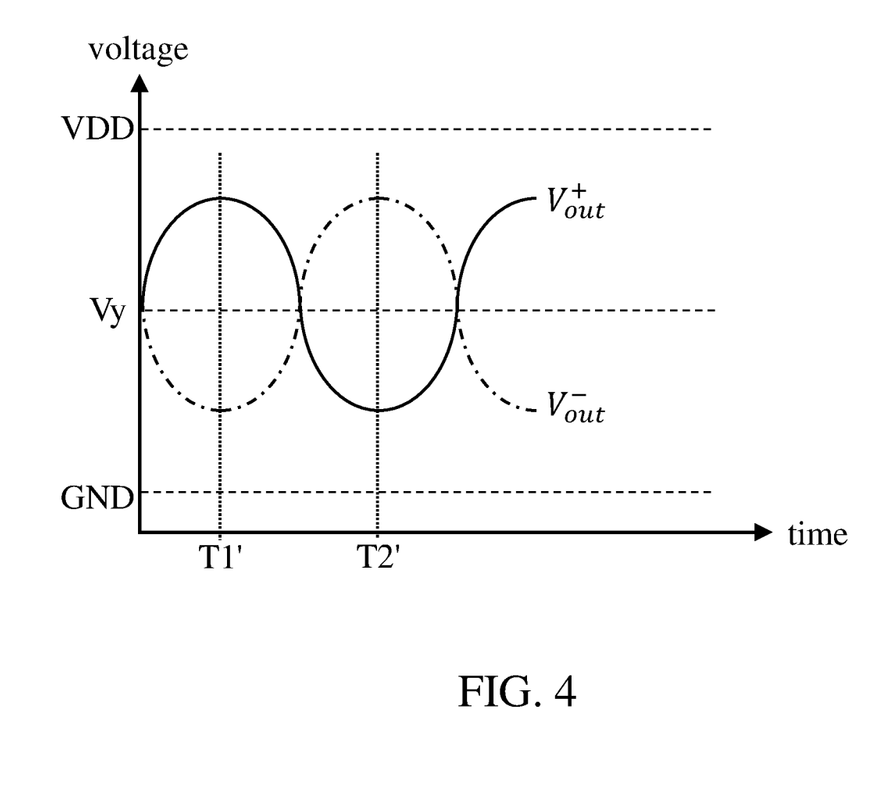
FIG. 4 shows a schematic diagram of the waveforms of the output signal, the power supply voltage, and the ground level according to an embodiment.

FIG. 4 shows a schematic diagram of the waveforms of the output signal $V_{out}^+$, the output signal $V_{out}^-$, the power supply voltage VDD, and the ground level GND according to an embodiment. The voltage Vy is the common mode voltage of the output signal $V_{out}^+$ and the output signal $V_{out}^-$. At the time point T1', the output signal $V_{out}^+$ is at its maximum value and the output signal $V_{out}^-$ is at its minimum value. At the time point T2', the output signal $V_{out}^+$ is at its minimum value and the output signal $V_{out}^-$ is at its maximum value. Because the current Ia is dependent on the output signal $V_{out}^+$, and the current Ib is dependent on the output signal $V_{out}^-$, the amount of charge that the load capacitor CL1 discharges and the amount of charge that the capacitor C2a discharges (which are proportional to the voltage difference between the terminal voltage of the capacitor at the time point T3 and the terminal voltage of the capacitor at the time point T2) are dependent on the current Ia (i.e., dependent on the output signal $V_{out}^+$), and the amount of charge that the load capacitor CL2 charges and the amount of charge that the capacitor C2b charges (which are proportional to the voltage difference between the terminal voltage of the capacitor at the time point T3 and the terminal voltage of the capacitor at the time point T2) are dependent on the current Ib (i.e., dependent on the output signal $V_{out}^-$), whether the output signal $V_{out}^+$ and the output signal $V_{out}^-$ are large or small.

As shown in FIG. 4, because the amplitude of the output signal $V_{out}^+$ (amplitude=|$V_{out}^+$−Vy|) and the amplitude of the output signal $V_{out}^-$ (amplitude=|$V_{out}^-$−Vy|) are substantially the same at any time point (i.e., the changes in the drain-source voltage of the current source 220 and the current source 230 are substantially the same), the amount of change in the current Ia is closely related to the amount of change in the current Ib. Therefore, the decrease of the terminal voltage of the load capacitor CL1 in the phase E (i.e., the voltage difference ΔVL1, which is dependent on the amount of change in the current Ia) is proportional to the increase of the terminal voltage of the capacitor C2b in the phase E (i.e., the voltage difference ΔVB, which is dependent on the amount of change in the current Ib), and the increase of the terminal voltage of the load capacitor CL2 in the phase E (i.e., the voltage difference ΔVL2, which is dependent on the amount of change in the current Ib) is proportional to the decrease of the terminal voltage of capacitor C2a in the phase E (i.e., the voltage difference ΔVA, which is dependent on the amount of change in the current Ia). By properly designing the capacitance values of the capacitors C2a and C2b, the user can make the voltage difference ΔVL1 match the voltage difference ΔVB (e.g., |ΔVL1|≈|ΔVB|) and the voltage difference ΔVL2 match the voltage difference ΔVA (e.g., |ΔVL2|≈|ΔVA|).

Reference is made to both FIG. 2 and FIG. 3. The switch S7a and the switch S7b are turned on in the phase X (i.e., between the time point T3 and the time point T4) and are turned off at other times. In other words, between the time point T3 and the time point T4, the switch S6a and the switch S6b are turned off and the switch S7a and the switch S7b are turned on, so that the voltage difference ΔVB of the capacitor C2b can offset the voltage difference ΔVL1 of the load capacitor CL1, and the voltage difference ΔVA of the capacitor C2a can offset the voltage difference ΔVL2 of the load capacitor CL2. As a result, the output signal $V_{out}^+$ and the output signal $V_{out}^-$ become less susceptible to the fluctuation of the current Ia and the current Ib (i.e., the SC circuit 200 becomes more linear).

Figure 5:
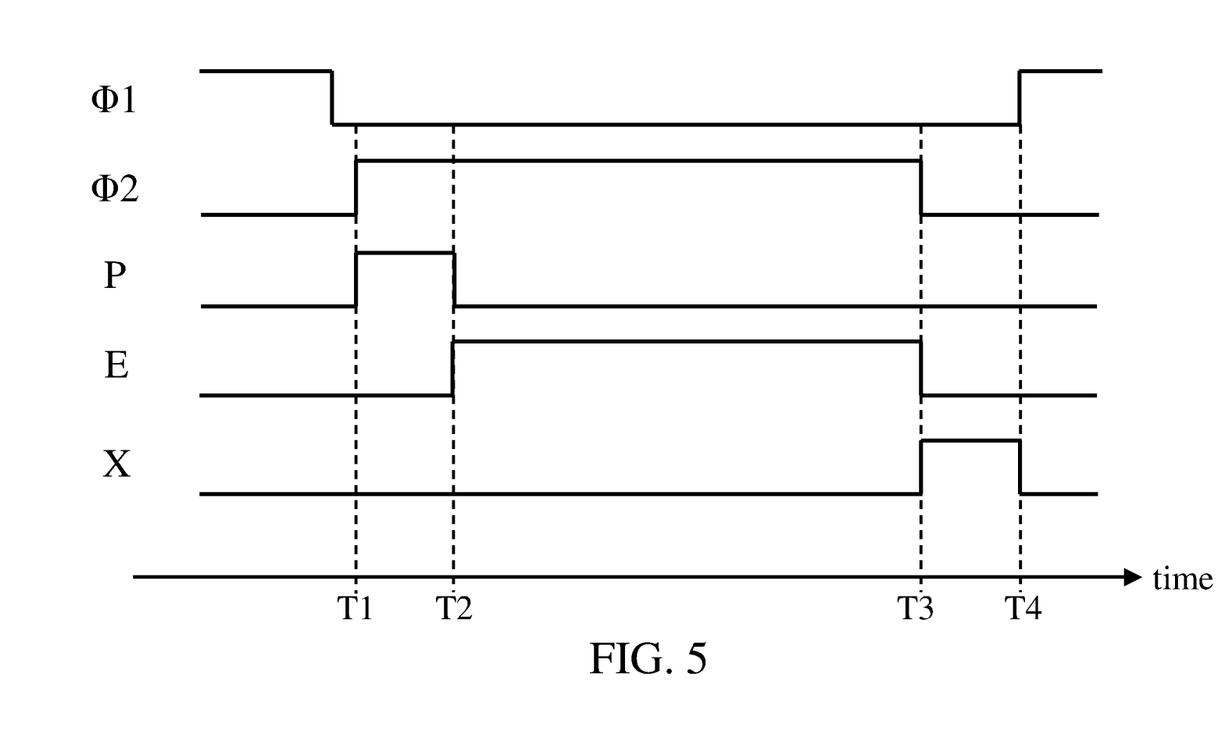
FIG. 5 is a timing diagram according to another embodiment of the present invention.

FIG. 5 is a timing diagram according to another embodiment of the present invention. In this embodiment, the phase X starts after the holding phase ends (after the time point T3, corresponding to the clock Φ2 being at the second level) and ends before the sampling phase starts (before the time point T4, corresponding to the clock Φ1 being at the first level).

In view of the foregoing, since the compensation circuit 240 can offset the over-discharge of the load capacitor CL1 by the current source 220 and the over-charge of the load capacitor CL2 by the current source 230, the SC circuit 200 becomes more linear.

Please note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A comparator-based switched-capacitor circuit (SC circuit) having a first input terminal, a second input terminal, a first output terminal, and a second output terminal, the first output terminal outputting a first output signal and the second output terminal outputting a second output signal, the comparator-based SC circuit comprising:
   a comparator;
   a first switch;
   a second switch;
   a third switch;
   a fourth switch;
   a fifth switch;
   a sixth switch;
   a seventh switch;
   an eighth switch;
   a ninth switch;
   a tenth switch;
   a first current source coupled to the comparator and the first output terminal;
   a second current source coupled to the comparator and the second output terminal;
   a first capacitor having a first end and a second end, the first end being coupled to the first input terminal through the first switch and coupled to the first output terminal through the fourth switch, the second end being coupled to the comparator and coupled to a reference voltage through the third switch;
   a second capacitor having a third end and a fourth end, the third end being coupled to the first input terminal through the second switch and coupled to the reference voltage through the fifth switch, the fourth end being coupled to the comparator and coupled to the reference voltage through the third switch;
   a third capacitor having a fifth end and a sixth end, the fifth end being coupled to the second input terminal through the sixth switch and coupled to the second output terminal through the ninth switch, the sixth end being coupled to the comparator and coupled to the reference voltage through the eighth switch;
   a fourth capacitor having a seventh end and an eighth end, the seventh end being coupled to the second input terminal through the seventh switch and coupled to the reference voltage through the tenth switch, the eighth end being coupled to the comparator and coupled to the reference voltage through the eighth switch; and
   a compensation circuit coupled to the first output terminal and the second output terminal and configured to generate a first voltage difference corresponding to the first output signal and a second voltage difference corresponding to the second output signal, and to apply the first voltage difference and the second voltage difference to the second output terminal and the first output terminal, respectively.

2. The comparator-based SC circuit of claim 1, wherein the first current source provides a first current, the second current source provides a second current, the compensation circuit comprising:
   a fifth capacitor discharging through the first current to generate the first voltage difference; and
   a sixth capacitor charging through the second current to generate the second voltage difference.

3. The comparator-based SC circuit of claim 2, wherein the compensation circuit further comprises:
   an eleventh switch coupled between the fifth capacitor and the first output terminal;
   a twelfth switch coupled between the sixth capacitor and the second output terminal;
   a thirteenth switch coupled between the sixth capacitor and the first output terminal; and
   a fourteenth switch coupled between the fifth capacitor and the second output terminal.

4. The comparator-based SC circuit of claim 3, wherein the comparator-based SC circuit operates in a first phase or a second phase; in the first phase, the first switch, the second switch, the third switch, the sixth switch, the seventh switch, and the eighth switch are turned on, and the fourth switch, the fifth switch, the ninth switch, and the tenth switch are turned off; in the second phase, the first switch, the second switch, the third switch, the sixth switch, the seventh switch, and the eighth switch are turned off, and the fourth switch, the fifth switch, the ninth switch, and the tenth switch are turned on.

5. The comparator-based SC circuit of claim 4, wherein the second phase comprises a first sub-phase and a second sub-phase, and the second sub-phase is later than the first sub-phase; in the first sub-phase, the eleventh switch and the twelfth switch are turned on, and the thirteenth switch and the fourteenth switch are turned off; in the second sub-phase, the eleventh switch and the twelfth switch are turned off, and the thirteenth switch and the fourteenth switch are turned on.

6. The comparator-based SC circuit of claim 4, wherein the second phase comprises a sub-phase, there is a third phase between the second phase and the first phase, and the third phase is later than the sub-phase; in the sub-phase, the eleventh switch and the twelfth switch are turned on, and the thirteenth switch and the fourteenth switch are turned off; in the third phase, the eleventh switch and the twelfth switch are turned off, and the thirteenth switch and the fourteenth switch are turned on.

7. A comparator-based switched-capacitor circuit (SC circuit) having a first input terminal, a second input terminal, a first output terminal, and a second output terminal, the first output terminal outputting a first output signal and the second output terminal outputting a second output signal, the comparator-based SC circuit comprising:
   a comparator;
   a first switch;
   a second switch;
   a third switch;
   a fourth switch;
   a fifth switch;
   a sixth switch;
   a seventh switch;
   an eighth switch;
   a ninth switch;
   a tenth switch;
   an eleventh switch;
   a twelfth switch;
   a thirteenth switch;
   a fourteenth switch;
   a first current source coupled to the comparator and the first output terminal;
   a second current source coupled to the comparator and the second output terminal;
   a first capacitor having a first end and a second end, the first end being coupled to the first input terminal through the first switch and coupled to the first output terminal through the fourth switch, the second end being coupled to the comparator and coupled to a first reference voltage through the third switch;

a second capacitor having a third end and a fourth end, the third end being coupled to the first input terminal through the second switch and coupled to the first reference voltage through the fifth switch, the fourth end being coupled to the comparator and coupled to the first reference voltage through the third switch;

a third capacitor having a fifth end and a sixth end, the fifth end being coupled to the second input terminal through the sixth switch and coupled to the second output terminal through the ninth switch, the sixth end being coupled to the comparator and coupled to the first reference voltage through the eighth switch;

a fourth capacitor having a seventh end and an eighth end, the seventh end being coupled to the second input terminal through the seventh switch and coupled to the first reference voltage through the tenth switch, the eighth end being coupled to the comparator and coupled to the first reference voltage through the eighth switch;

a fifth capacitor having a ninth end and a tenth end, the ninth end being coupled to the first output terminal through the eleventh switch and coupled to the second output terminal through the fourteenth switch, the tenth end being coupled to a second reference voltage; and a sixth capacitor having an eleventh end and a twelfth end, the eleventh end being coupled to the second output terminal through the twelfth switch and coupled to the first output terminal through the thirteenth switch, the twelfth end being coupled to the second reference voltage.

8. The comparator-based SC circuit of claim 7, wherein the comparator-based SC circuit operates in a first phase or a second phase; in the first phase, the first switch, the second switch, the third switch, the sixth switch, the seventh switch, and the eighth switch are turned on, and the fourth switch, the fifth switch, the ninth switch, and the tenth switch are turned off; in the second phase, the first switch, the second switch, the third switch, the sixth switch, the seventh switch, and the eighth switch are turned off, and the fourth switch, the fifth switch, the ninth switch, and the tenth switch are turned on.

9. The comparator-based SC circuit of claim 8, wherein the second phase comprises a first sub-phase and a second sub-phase, and the second sub-phase is later than the first sub-phase; in the first sub-phase, the eleventh switch and the twelfth switch are turned on, and the thirteenth switch and the fourteenth switch are turned off; in the second sub-phase, the eleventh switch and the twelfth switch are turned off, and the thirteenth switch and the fourteenth switch are turned on.

10. The comparator-based SC circuit of claim 8, wherein the second phase comprises a sub-phase, there is a third phase between the second phase and the first phase, and the third phase is later than the sub-phase; in the sub-phase, the eleventh switch and the twelfth switch are turned on, and the thirteenth switch and the fourteenth switch are turned off; in the third phase, the eleventh switch and the twelfth switch are turned off, and the thirteenth switch and the fourteenth switch are turned on.

* * * * *